(12) United States Patent
Dekker et al.

(10) Patent No.: US 8,530,906 B2
(45) Date of Patent: Sep. 10, 2013

(54) LIGHT EMITTING DEVICE ADAPTED FOR AC DRIVE

(75) Inventors: Tim Dekker, Eindhoven (NL); Adrianus Sempel, Eindhoven (NL); Theodorus Johannes Petrus Van Den Biggelaar, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 289 days.

(21) Appl. No.: 12/995,483

(22) PCT Filed: Jun. 11, 2009

(86) PCT No.: PCT/IB2009/052494
§ 371 (c)(1), (2), (4) Date: Dec. 1, 2010

(87) PCT Pub. No.: WO2009/153715
PCT Pub. Date: Dec. 23, 2009

(65) Prior Publication Data
US 2011/0084624 A1    Apr. 14, 2011

(30) Foreign Application Priority Data
Jun. 17, 2008   (EP) .................................... 08158366

(51) Int. Cl.
*H01L 27/15*   (2006.01)
(52) U.S. Cl.
USPC .................. 257/79; 257/82; 257/83; 257/88; 257/99
(58) Field of Classification Search
USPC .... 257/79, 82, 83, 88, 99, 250; 313/483–512
See application file for complete search history.

(56) References Cited

U.S. PATENT DOCUMENTS

| 5,410,328 A | 4/1995 | Yoksza et al. |
| 6,371,637 B1 | 4/2002 | Atchinson et al. |

(Continued)

FOREIGN PATENT DOCUMENTS

| DE | 4129059 A1 | 3/1993 |
| RU | 2250846 C2 | 4/2005 |

(Continued)

OTHER PUBLICATIONS

Rogers Corporation: "Durel Protolight Electroluminescent Cut-To-Fit Lamps"; Data Sheet Describing Rogers' EL Lamps, 2 Page Document.

*Primary Examiner* — Steven Loke
*Assistant Examiner* — Junaiden Mirsalahuddin
(74) *Attorney, Agent, or Firm* — John F. Salazar; Mark L. Beloborodov

(57) ABSTRACT

A light emitting device comprising a first common electrode (11; 21), a structured conducting layer (12; 22), forming a set of electrode pads (14; 24a, 24b) electrically isolated from each other, a dielectric layer (13; 23), interposed between the first common electrode layer (11; 21) and the structured conducting layer (12; 22), a second common electrode (15; 30), and a plurality of light emitting elements (16; 20a, 20b), each light emitting element being electrically connected between one of the electrode pads (14; 24a, 24b) and the second common electrode (15; 30), so as to be connected in series with a capacitor (18; 31) comprising one of the electrode pads (14; 24a, 24b), the dielectric layer (13; 23), and the first common electrode (11; 21). When an alternating voltage is applied between the first and second common electrodes, the light emitting elements will be powered through a capacitive coupling, also providing current limitation. During operation of the light emitting device, a shorts circuit failure in one light emitting element will affect only light emitting elements connected to the same capacitor. Further, the short circuit current will be limited by this capacitor.

11 Claims, 4 Drawing Sheets

(56) References Cited

U.S. PATENT DOCUMENTS

| | | |
|---|---|---|
| 6,635,990 B1 * | 10/2003 | Pichler .......................... 313/527 |
| 7,025,473 B2 | 4/2006 | Dokoupil |
| 2005/0251698 A1 | 11/2005 | Lynch et al. |
| 2006/0252336 A1 | 11/2006 | Daniels et al. |
| 2007/0001595 A1 * | 1/2007 | Nakagawa ................... 313/506 |
| 2007/0002570 A1 | 1/2007 | Souza et al. |
| 2008/0218095 A1 * | 9/2008 | Erhardt ........................ 315/224 |
| 2010/0002440 A1 * | 1/2010 | Negley et al. ............ 362/249.14 |

FOREIGN PATENT DOCUMENTS

| | | |
|---|---|---|
| WO | 03056878 A1 | 7/2003 |
| WO | 2006129291 A2 | 12/2006 |

\* cited by examiner

LIGHT EMITTING DEVICE ADAPTED FOR AC DRIVE

FIELD OF THE INVENTION

The present invention relates to a light emitting device with a plurality of light emitted elements adapted for AC drive, and a luminaire comprising such a light emitting device.

BACKGROUND OF THE INVENTION

Spectacular progress in the brightness, lumen efficacy and affordability of solid state light sources such as light-emitting-diodes (LEDs) enables new lighting applications that are no longer restricted to niche markets. LEDs offer several advantages over traditional light sources, such as long lifetime, superior efficiency, low operating voltage, design flexibility, more pure spectral colors, fast response times.

For these and other reasons, LEDs are becoming more and more suited for making illumination devices, like color variable luminaires, spotlights, LCD backlighting, architectural lighting, stage lighting, etc.

For many solid state light sources, such as organic LEDs (OLEDs), most efficient operation is achieved with DC biasing at the optimal efficacy point. For higher brightness levels, biasing above this point is required. Brightness can be controlled with Amplitude Modulation (AM) or with Pulse Width Modulation (PWM) where the LED is duty-cycled. Often PWM is applied for low losses in the driver, and allowing freedom of system supply voltage.

In some applications, light emitting devices covering a larger surface are required. Many LEDs are then connected in parallel on a substrate, or, in case of OLED, one or several OLED tiles covering a large surface are formed. When driving such light emitting devices, the occurrence of short circuits become a problem, as the entire system is short circuited and no light is emitted in case of a large short-circuit current. The current also results in unwanted power dissipation and heat generation.

Conventionally, this problem has been addressed by for example selecting OLED tiles with a sufficiently low chance for defects. Also burn-in procedures and reverse biasing is used to reduce and/or heal the effect of shorts. However, the occurrence of shorts in OLED for lighting applications may be difficult to avoid completely, due to the large area needed and the strive for simple low-cost technology with sufficient yield.

U.S. Pat. No. 7,052,473 proposes AC drive of LEDs, with two LEDs connected anti-parallel in series with a capacitor. During every current cycle, a limited amount of charge is forced through the LED resulting in a light flash. This charge is stored on the capacitor, which stops the current. The charge is available for the next cycle to be used again. The anti-parallel diode ensures back-flow of the charge. In this case full double-phase operation is assured.

SUMMARY OF THE INVENTION

It is an object of the present invention to provide a light emitting device with a plurality of light emitting elements in which short circuits occurring in one or several of the light emitting elements have limited impact on performance.

This and other objects are achieved by a light emitting device comprising a first common electrode, a structured conducting layer, forming a set of electrode pads electrically isolated from each other, a dielectric layer, interposed between the first common electrode layer and the structured conducting layer, a second common electrode, and a plurality of light emitting elements. Each light emitting element is electrically connected between one of the electrode pads and the second common electrode, so as to be connected in series with a capacitor comprising one of the electrode pads, the dielectric layer, and the first common electrode.

According to the present invention, a thin film layer (i.e. thickness in the order of micrometers) is used to provide capacitors that are connected in series with the light emitting elements, e.g. LEDs. The dielectric layer interposed between two conducting layers is used to create a capacitive coupling between the layers. One of the layers is then structured into pads, forming a plurality of independently connected capacitors. The light emitting elements are then connected between the pads and a common electrode, so that each light emitting element is connected in series with one of the capacitors.

When an alternating voltage is applied between the first and second common electrodes, the light emitting elements will be powered through a capacitive coupling, also providing current limitation. During operation of the light emitting device, a shorts circuit failure in one light emitting element will affect only light emitting elements connected to the same capacitor. Further, the short circuit current will be limited by this capacitor.

The capacitors are charged/discharged every cycle, so no loss of charge occurs and power dissipation is small. Any short-peak currents will introduce small resistive power-loss $I^2R$ across the resistance in the conductive layer.

The capacitance of each capacitor is determined by the thickness of the dielectric layer, its permittivity, and the area of each pad electrode. The current through each circuit will be determined by this capacitance, the applied voltage, and the frequency. Using typical materials and typical thickness for a dielectric carrier layer, a suitable frequency in the order of kHz can be obtained.

It should be noted that one or several of the light emitting elements may be connected to more than one pad, each such electrode pad forming part of a separate capacitor. Such a design may provide economical advantages.

The second common electrode can comprise an electrode mesh surrounding the electrode pads. In this case, at least a portion of each electrode pad can be adjacent to the electrode mesh. For example, each pad or groups of pads may be surrounded by the mesh. This allows connection of the light emitting elements in places where the pad is adjacent to the mesh, thus avoiding long connection wires or tracks. By keeping the connection wires or tracks short, the chances are increased that a specific light emitting element will be active when the device is cut to measure.

The light emitting elements may be light emitting diodes, including semi-conducting LEDs, small-molecule organic LEDs and polymer organic LEDs. In this case, the plurality of LEDs may include a first group having a cathode connected to one of the pads, and a second group having an anode connected to one of the pads. Such a design will enable LEDs of one group to be activated when a positive voltage is applied, and LEDs of the other group to be activated when a negative voltage is applied. This allows for an efficient use of the alternating power, ensuring that one group of LEDs is always active.

Each pad can be connected to a pair of anti-parallel connected LEDs, where the pair includes one LED from the first group and one LED from the second group. This will ensure that the alternating current through each capacitor is used efficiently to activate the various LEDs.

A device according to the present invention allows the presence of short circuits in the light emitting elements. The associated short-circuit current and loss of light will be restricted to one section of light emitting elements. This is particularly advantageous when the light emitting elements are such that their light emitting characteristics depend on the current through the device, such as light emitting diodes. A device according to the present invention is thus suitable for any light emitting device with a plurality of LEDs that are driven by a common power (voltage) source. A specific example is OLED applications, where the presence of short circuits in the organic layers is extremely difficult and expensive to avoid completely.

In case of an OLED application, the carrier formed by the first common electrode, dielectric layer and pads, can act as a substrate, on which organic layers, forming the OLEDs, are deposited. The organic layers must be aligned with the pads, so that one OLED is formed on top of each pad. Further, the polarity of the OLEDs must be alternatingly arranged. In this case, the entire light emitting device has a layered structure.

Further, in numerous occasions it is desirable that an illumination device is cut to measure i.e. its size and shape can easily be altered, so it will fit in any room and it can serve many purposes. A complex example of such an illumination device is described in US 2005/0251698. For this purpose, the carrier composed of the common electrode layer, the structured electrode layer and the dielectric layer formed by materials suitable for being cut, e.g. by forming the various layers of suitable materials and thickness. The entire carrier, comprising the conductive layers and intermediate dielectric, may be cut to measure to any shape and size, even letters and figures, without destroying the capacitive coupling.

According to this embodiment of the present invention, there is no need for jumpers, vias, parallel connectors, etc, that are required in prior art cut-to-measure illumination devices. The device is therefore easy to manufacture cost efficiently.

A light emitting device according to the present invention may be combined with a small low voltage power supply to form a product which can find its way in numerous markets, such as signage, indoor architects, schools, wearable electronics and photonic textiles. If deemed advantageous, in order to give the lamp a certain optical functionality, it can be equipped with specific optical components such as diffusers, lenses, collimators etc.

The light emitting device may be particularly useful in a luminaire, i.e. a device intended to illuminate an object or a surrounding.

It is noted that the invention relates to all possible combinations of features recited in the claims.

BRIEF DESCRIPTION OF THE DRAWINGS

This and other aspects of the present invention will now be described in more detail, with reference to the appended drawings showing a currently preferred embodiment of the invention.

DETAILED DESCRIPTION OF EMBODIMENTS OF THE INVENTION

Figure 1:
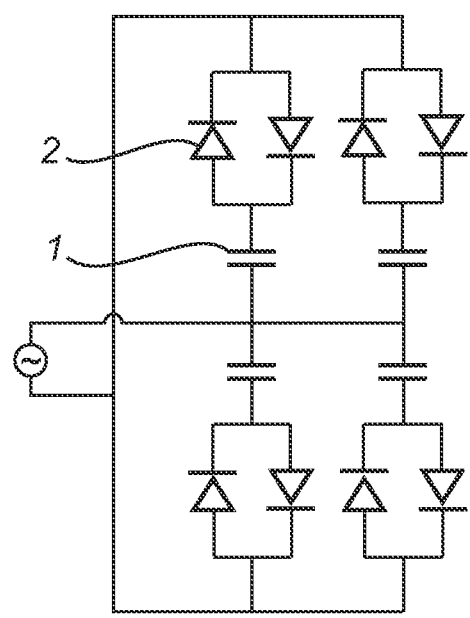
FIG. 1 shows a circuit diagram of a prior art LED array.

FIG. 1 shows a circuit diagram of a light emitting device adapted to AC drive, with a plurality of LEDs, connected according to U.S. Pat. No. 7,052,473. Capacitors 1 are each connected in series with a pair of anti-parallel LEDs 2. It is apparent from FIG. 1 that any LED can be taken out of the matrix, without influencing the function of the other LEDs, apart from the single anti-parallel connected neighbor LED. However, as each pair of LEDs requires its own pair of power wires, this is a difficult and expensive approach for a device with a large number of LEDs.

The process of manufacturing a light emitting device 5 according to a first embodiment of the present invention will now be described with reference to FIG. 2a-c.

Figure 2A:
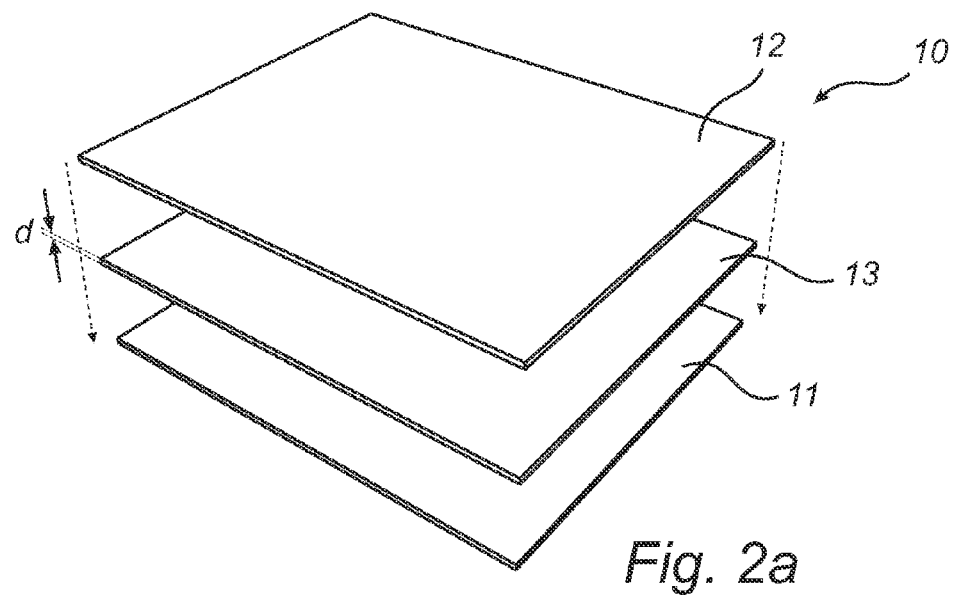
FIG. 2a-c shows various steps of manufacturing a light emitting device according to a first embodiment of the present invention.
Figure 2B:
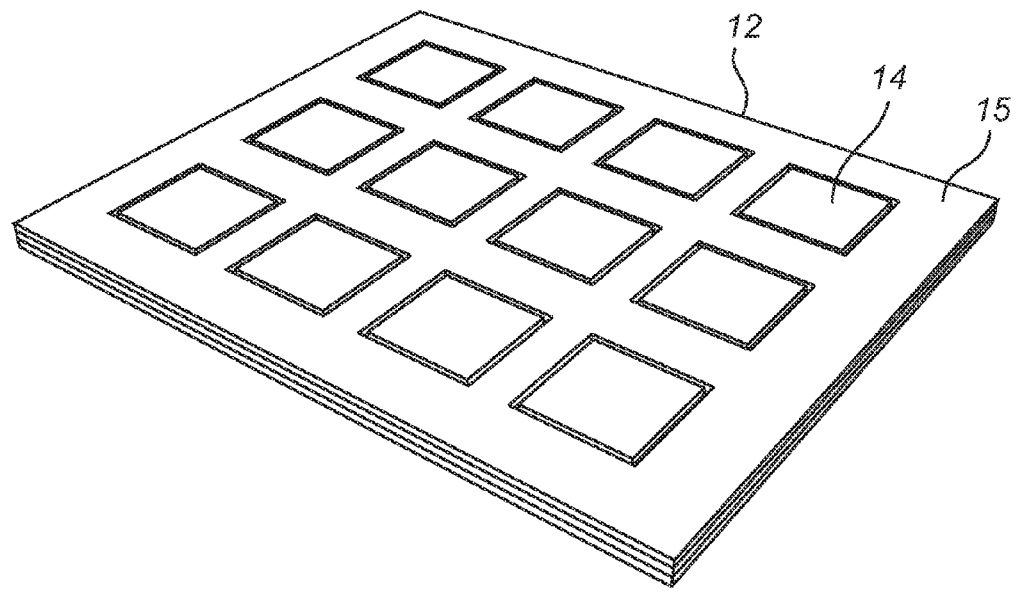

First, in FIG. 2a, a carrier 10 is formed by three layers: a first and a second conducting layer 11, 12 and an intermediate dielectric layer 13. The dielectric layer 13 can have the form of a thin-film layer with high permittivity. A carrier 10 of this kind may be manufactured using conventional techniques used for manufacturing circuit boards. The carrier 10 may obviously comprise additional layers in addition to these three layers, for example a structural support layer in a case where the carrier requires structural strength, or a protective cover layer if the carrier may be exposed to physical stress.

The first conducting layer 11 forms a common electrode. As illustrated in FIG. 2b, the second conducting layer 12 is structured using a conventional technique such as etching. The layer is structured into a plurality of electrode pads 14, that are isolated from each other and from a surrounding electrode mesh 15. In the illustrated embodiment, the pads are each completely surrounded by the mesh, but alternatively two or more pads are grouped adjacent to each other, and the entire group then surrounded by the mesh. However, it is advantageous if at least a portion of the edge of each pad extends along the mesh.

Figure 2C:
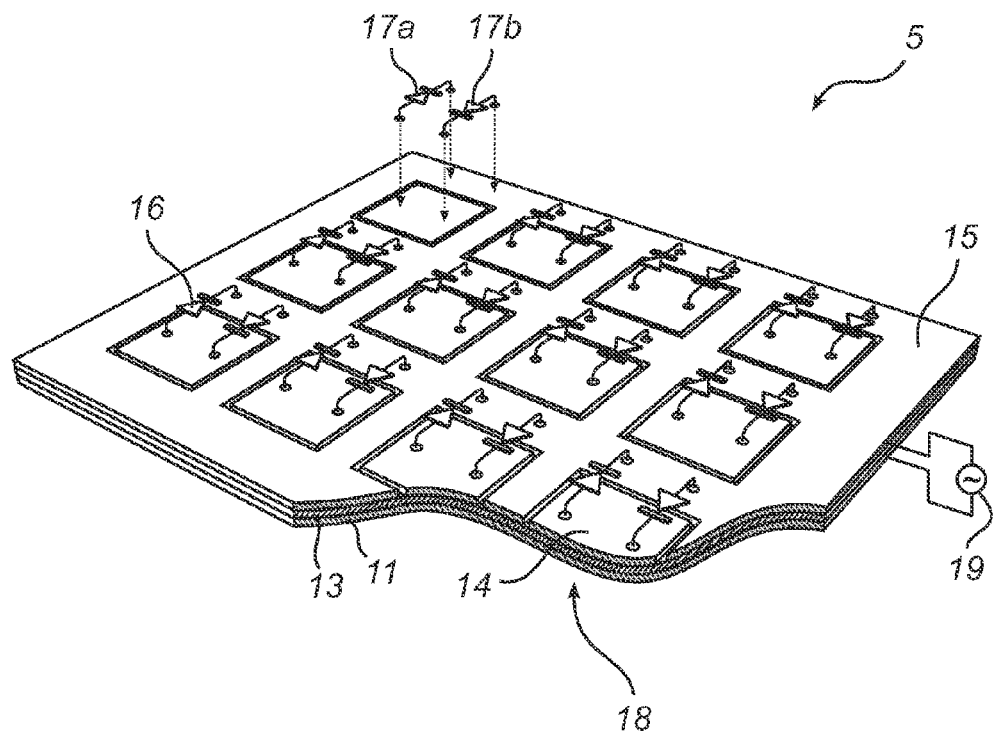

In FIG. 2c, a light emitting element 16 is connected between each pad and the mesh. In the illustrated example, the light emitting elements are light emitting diodes (LEDs), and a pair of LEDs 17a, 17b is connected in parallel between each electrode pad 14 and the mesh 15. One of the LEDs 17a is connected with its anode to the pad 14 and its cathode to the mesh 15, while the other LED 17b is connected with its cathode to the pad 14 and its anode to the mesh 15.

Each LED pair 17a, 17b is thus connected in series with a capacitor 18 formed by one of the electrode pads 14, the dielectric layer 13, and the common electrode 11. In other words, each pad forms one terminal of a separate capacitor 18, having its other terminal in common with a plurality of other capacitors.

As a LED only allows a flow of current in one direction, the circuit would not be operable if only one LED was connected in series with the capacitor. Of course, it could be connected in parallel with any other type of diode, or even with a resistor, but such a design would cause reduced efficiency and additional cost. By using two anti-parallel LEDs, each one of the LEDs will generate light during each half cycle of an alternating power source, and essentially all current will contribute to the generation of light.

When an alternating voltage 19 is applied between the bottom conducting layer 11 and the mesh 15, an alternating current will flow through each capacitor 18, and all the LEDs will be activated. Due to the anti-parallel connection of the LEDs, a first group of LEDs will be activated when the current flows in a first direction, while a second group of LEDs will be activated when the current flows in a second direction.

Figure 3:
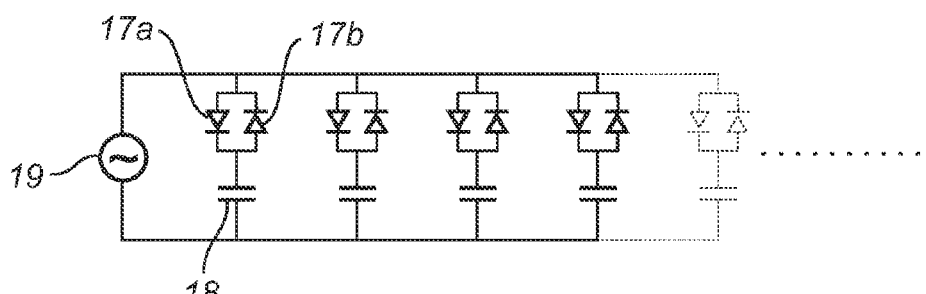
FIG. 3 shows a circuit diagram of the device in FIG. 2c.

The capacitors will act as current limiters, and the carrier can be cut to measure without affecting the functionality. The resulting circuit diagram is depicted in FIG. 3. It is easy to realize that this circuit is functionally equivalent to the circuit in FIG. 1.

The alternating current that flows through the LEDs is limited by the capacitors impedance, and can be calculated from $I=U\cdot 2\cdot JI\cdot F\cdot C$, where I is the effective current, U is the effective voltage, f is the driving frequency and C is the capacitance of each capacitor. The capacitance C will in turn depend on the area of each pad, the thickness of the dielectric layer, and the permittivity of the dielectric.

In order to ensure satisfactory working conditions, a sufficient current must be obtained for a desired voltage level. For this purpose, the capacitance of each capacitor 18 and the driving frequency have to be matched with the available voltage, to obtain the required drive current. The desired value for the capacitance of each capacitor 18 will therefore be a trade-off between minimizing the short circuit current, and maximizing the light-output for a given supply voltage.

A typical thickness in conventional circuit board manufacturing processes is 10-50 μm. Using an inexpensive dielectric material, with a relative permittivity ($\in$) of around 3-6, the capacitance will therefore be fairly low. For instance, assuming a typical drive voltage of around 10 V, a relatively high drive frequency, e.g. in the order of 50-100 kHz, will be required to obtain a sufficient driving current, e.g. around of around 0.3 mA per $cm^2$. However for higher permittivity values, higher driving voltages and larger pad area, the available current increases proportionally. It is clear that also non-sinusoidal AC signals can be applied like saw-tooth, square wave etc.

Techniques conventionally used in class D amplifiers are suited for this purpose. Such amplifiers have an extreme high electrical efficiency and are very cost efficient, so they are well suited to act as drivers for this cut to measure lamp.

As mentioned, the light emitting elements 16 may be semi-conducting LEDs. Alternatively, they may be organic LEDs.

Figure 4:
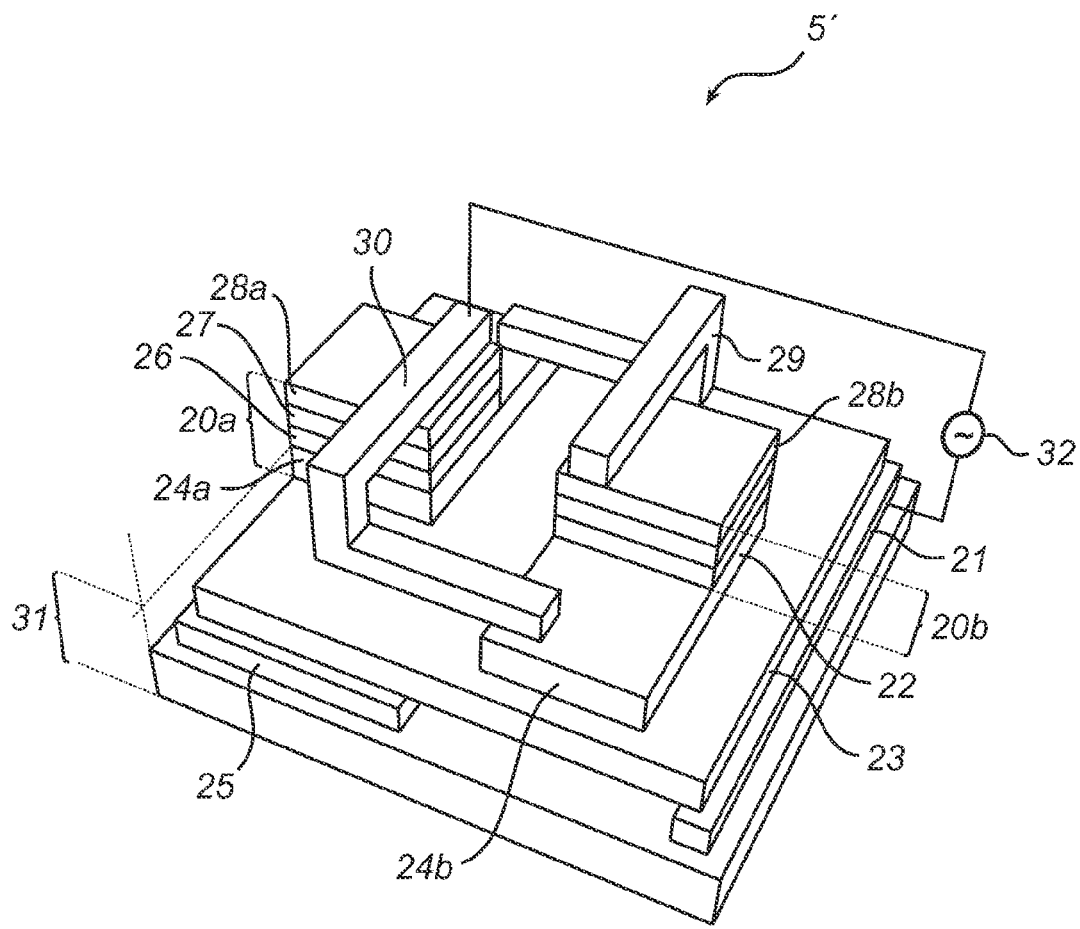
FIG. 4 shows schematic perspective view of a light emitting device according to a second embodiment of the present invention.

A further embodiment of the present invention, especially suitable for OLED implementation is illustrated in FIG. 4, showing two anti-parallel OLEDs 20a, 20b.

As shown in FIG. 4, the illumination device 5' here again comprises first and second conductive layers 21, 22, and an intermediate dielectric layer 23. However, the second conductive layer 22 is here only divided into pads 24a, 24b, without any surrounding mesh. Instead, the pads 24a, 24b act as substrates, on which organic layers 26, 27 are deposited to form the OLEDs 20a, 20b. The organic layers typically comprise a hole-injection layer 26 (e.g. PEDOT) and a light emissive layer 27 (e.g. PPV). The organic layers 26, 27 are aligned with the pads, so that one OLED is formed on top of each pad. On top of the upper organic layer 27 of each OLED is deposited a final conducting layer to form a diode cathode 28a, 28b.

In order to connect the two OLEDs in anti-parallel, the first conducting layer 21 is also structured, to form electrodes 25 that extend beneath one OLED in each pair of anti-parallel OLEDs. For example, an electrode 25 may extend beneath a row of OLEDs. Further, a first interconnecting element 29 is arranged to connect the pad 24a of the OLED located on top of the electrode 25 to the upper terminal 28b of the other OLED, and a second interconnecting element 30 is arranged to connect the upper terminal 28a of the OLED located on top of the electrode 25 to the pad 24b of the second OLED. The result is a pair of OLEDs connected in parallel with reversed polarity, and connected in series with a capacitor 31 formed by the dielectric layer 23 between the pad 24a and electrode 25.

A voltage source 32 is connected between the first conducting layer 21, which forms a first common electrode, and the interconnecting element 30, which forms a second common electrode.

In an alternative embodiment, the dielectric layer 23 is structured, so as to extend underneath only one of the diodes. In this case the conducting layer 21 does not need to be structured into electrodes 25.

In the embodiment shown in FIG. 4, both diodes are constructed simultaneously, according to the same layer deposition order, i.e. with layer 27 on top of layer 26. In an alternative embodiment, the organic layers 26 and 27 are deposited in reversed order on the pads 24a and 24b. This can be done by adequate technologies of material removal (etching, ablation etc) and material deposition (printing, spin-casting, evaporation etc). In this case, the interconnecting elements 29, 30 are not required. Further, neither the conducting layer 21 nor the dielectric layer 23 need to be structured.

Also implementations in small molecule OLED technologies are possible, where the layers 26 and 27 are replaced by a stack of layers, typically consisting of combinations of hole-electron injection-blocking layers combined with emissive layers. Even single layer solutions are possible where layers 26, 27 are combined in one layer, and the diode behavior is obtained by proper choice of the materials inlayers 22 and 28a, 28b.

Depending of the expected likelyhood for a short circuit in the OLED layers 26 (sometimes referred to as OLED "short-density" per area unit), the number of capacitors should be chosen sufficiently large to allow for minimal loss of non-functional area. This will ensure that a failing section (OLEDs connected to one capacitor) is sufficiently small not to add too much short-circuit current and not to reduce too much the light-output. For instance, a given OLED tile with 100 expected shorts still operates at 90% of its maximum performance if the tile is divided in 1000 sections (which corresponds to 2000 'pixels').

The person skilled in the art realizes that the present invention by no means is limited to the preferred embodiments described above. On the contrary, many modifications and variations are possible within the scope of the appended claims. For example, the shape and arrangement of the electrode pads may be modified, as may the orientation and distribution of light emitting elements. Also, it is noted that the light emitting elements not necessarily are light emitting diodes. On the contrary, various light emitting elements may be suitable for use in a light emitting device according to the present invention. Finally, it should be noted that the present invention is applicable also to AC Electro Luminescence (EL) systems.

The invention claimed is:

1. A light emitting device comprising:
    a first common electrode,
    a structured conducting layer, forming a set of electrode pads electrically isolated from each other and forming an electrode mesh surrounding said electrode pads,
    a dielectric layer, interposed between said first common electrode layer and said structured conducting layer, and
    a plurality of light emitting elements, each light emitting element being electronically connected between one of said electrode pads and said electrode mesh, so as to be connected in series with a capacitor comprising:
    said one of said electrode pads,
    said dielectric layer, and
    said first common electrode.

2. The light emitting device according to claim 1, wherein at least one of said light emitting elements is electrically connected between one of said electrode pads, and said electrode mesh, each such electrode pad forming part of a separate capacitor.

3. The light emitting device according to claim 1, wherein said structured conducting layer is structured such that at least a portion of each electrode pad is adjacent to said electrode mesh.

4. The light emitting device according to claim 1, wherein each light emitting element is connected with a first terminal to one of said electrode pads, and a second terminal to said electrode mesh, so as to be connected in series with a capacitor formed by said one of said electrode pads, said dielectric layer, and said common electrode.

5. The light emitting device according to claim 1, wherein said plurality of light emitting elements includes a first group of light emitting diodes each having an anode connected to one of said electrode pads, and a second group of light emitting diodes each having a cathode connected to one of said electrode pads.

6. The light emitting device according to claim 5, wherein each electrode pad is connected to a pair of anti-parallel connected light emitting diodes, said pair of anti-parallel connected light emitting diodes including one light emitting element from said first group and one light emitting element from said second group.

7. The light emitting device according to claim 1, wherein the light emitting elements are organic light emitting diodes (OLEDs).

8. The light emitting device according to claim 7, wherein organic layers forming said OLEDs are deposited onto the structured conducting layer as a substrate.

9. The light emitting device according to claim 1, wherein said first common electrode, said structured conducting layer and said dielectric layer are formed by materials suitable for being cut, so as to form a light emitting device that is cut-to-measure.

10. The light emitting device according to claim 1, further comprising an alternating voltage power supply for providing an alternating voltage between said first common electrode and said electrode mesh.

11. A light emitting device comprising:
a first common electrode;
a structured conducting layer forming a set of electrode pads electrically isolated from each other and forming an electrode mesh surrounding said electrode pads;
a dielectric layer interposed between said first common electrode layer and said structured conducting layer;
a plurality of light emitting elements each being electronically connected between one of said electrode pads and said electrode mesh so as to be connected in series with a capacitor formed by
said one of said electrode pads,
said dielectric layer, and
said first common electrode;
wherein each of the light emitting elements is connected with a first terminal to one of said electrode pads and a second terminal to said electrode mesh so as to be connected in series with the capacitor;
wherein said plurality of light emitting elements includes a first group of light emitting diodes each having an anode connected to one of said electrode pads and a second group of light emitting diodes each having a cathode connected to one of said electrode pads;
each electrode pad connected to a pair of anti-parallel connected light emitting diodes, said pair of anti-parallel connected light emitting diodes including one light emitting element from said first group and one light emitting element from said second group.

* * * * *